(12) United States Patent
Soer et al.

(10) Patent No.: US 7,771,896 B2
(45) Date of Patent: Aug. 10, 2010

(54) PATTERNING DEVICE, METHOD OF PROVIDING A PATTERNING DEVICE, PHOTOLITHOGRAPHIC APPARATUS AND DEVICE MANUFACTURING METHOD

(75) Inventors: Wouter Anthon Soer, Nijmegen (NL); Vadim Yevgenyevich Banine, Helmond (NL); Maarten Marinus Johannes Wilhelmus Van Herpen, Heesch (NL)

(73) Assignee: ASML Netherlands B.V., Veldhoven (NL)

( * ) Notice: Subject to any disclaimer, the term of this patent is extended or adjusted under 35 U.S.C. 154(b) by 889 days.

(21) Appl. No.: 11/643,953

(22) Filed: Dec. 22, 2006

(65) Prior Publication Data

US 2008/0151215 A1 Jun. 26, 2008

(51) Int. Cl.
*G03F 1/00* (2006.01)
(52) U.S. Cl. .......................................................... 430/5
(58) Field of Classification Search ...................... 430/5, 430/322; 378/35
See application file for complete search history.

(56) References Cited

U.S. PATENT DOCUMENTS

| | | | |
|---|---|---|---|
| 6,645,679 B1 * | 11/2003 | La Fontaine et al. | 430/5 |
| 6,777,140 B2 * | 8/2004 | Singh et al. | 430/5 |
| 6,819,469 B1 | 11/2004 | Koba | |
| 2004/0051856 A1 | 3/2004 | Bleeker et al. | |
| 2004/0062999 A1 | 4/2004 | Stearns et al. | |
| 2007/0049011 A1 * | 3/2007 | Tran | 438/637 |

FOREIGN PATENT DOCUMENTS

WO WO 2006/114544 A 11/2006

OTHER PUBLICATIONS

International Search Report for Appln. No. PCT/NL2007/050691 issued Apr. 29, 2008, 4 pgs.

* cited by examiner

*Primary Examiner*—Stephen Rosasco
(74) *Attorney, Agent, or Firm*—Sterne, Kessler, Goldstein & Fox P.L.L.C.

(57) ABSTRACT

A patterning device for a photolithographic apparatus is used to form a patterned radiation beam, by imparting a cross-sectional pattern to the radiation beam during reflection from the patterning device. The patterning device comprises a layer of phase-change material that is capable of locally undergoing an induced structural phase change into respective ones of a plurality of stable and/or metastable states. Furthermore, the patterning device comprises a radiation reflective structure with periodically arranged layers adjacent to the layer of phase-change material. The radiation reflective structures do not partake in the phase changes. By locally changing the phase of the phase-change material, the reflectivity of the whole structure is modified, for example due to thickness changes in the layer of phase-change material that lead to destructive interference of different components of the reflected light or due to changes in surface roughness of the radiation reflective structure.

21 Claims, 5 Drawing Sheets

PATTERNING DEVICE, METHOD OF PROVIDING A PATTERNING DEVICE, PHOTOLITHOGRAPHIC APPARATUS AND DEVICE MANUFACTURING METHOD

FIELD

The present invention relates to a reflective patterning device (also called a reticle or mask), a method of patterning a beam of radiation, a lithographic apparatus and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

For manufacturing different designs of integrated circuits different patterning devices (masks or reticles) have to be made. In the case of design errors new patterning devices have to be made. This contributes significantly to device costs, especially when small series of integrated circuits have to be manufactured. Accordingly, there have been attempts to provide for rewriteable patterning devices.

U.S. Pat. No. 6,819,469 discloses a "light modulator" for a 3D holographic display. The document mentions that the light modulator can also be used for lithography. This light modulator comprises a surface with one or more layers of phase-change material thereon, which can be brought from a crystalline to an amorphous state and back. Various methods for effecting such a phase change are described, including use of electrodes on the layer and optical heating. The phase-change layer can be used to modulate reflection using interference between light reflected from different surfaces of the layer.

In order to reduce integrated circuit feature size it is desirable to reduce the wavelength of radiation used to transfer the pattern from the patterning device to substrates. Wavelengths as far down as the EUV range have been proposed for this purpose. The light modulator of U.S. Pat. No. 6,819,469 is intended for use in the visible part of the spectrum. It is difficult to apply the described type of "light modulator" for shorter wavelengths, such as wavelengths in the EUV range. For one reason this is due to less than optimal optical properties of phase-change materials at shorter wavelengths. Also it is difficult to write patterns into the light modulator with sufficient detail.

SUMMARY

It is desirable to provide for a rewriteable patterning device for use in transfer of patterns from the patterning device to a substrates through short wavelength radiation, such as EUV radiation, wherein improved optical properties are realized.

According to an aspect, there is provided a patterning device for imparting a cross-sectional pattern to a radiation beam during reflection to form a patterned radiation beam, the patterning device comprising:

a layer of phase-change material capable of locally undergoing an induced structural phase change into respective ones of a plurality of stable and/or metastable states;

a radiation reflective structure with periodically arranged layers adjacent to the layer of phase-change material, the radiation reflective structure being composed of a material or materials whose structural phase remains unaffected when a phase change is induced in the layer of phase-change material.

According to an aspect, there is provided a method of providing a reflective patterning device for imparting a beam pattern to a beam of radiation during reflection of the beam of radiation, the method comprising providing a layer of phase-change material adjacent to a reflective periodic multilayer structure in the reflective patterning device, the reflective periodic multilayer structure being composed of materials that remain unaffected when phase changes are induced in the layer of phase-change material;

heating the layer of phase-change material with a position dependent heating pattern as a function of position in the layer of phase-change material, with a time dependence and/or heating intensity that induces local phase changes in the layer of phase-change material, defining a pattern of areas with mutually different phases in the layer of phase-change material.

According to an aspect a lithographic projection apparatus with such a projection device is provided.

According to an aspect, there is provided a device manufacturing method using such a patterning device.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
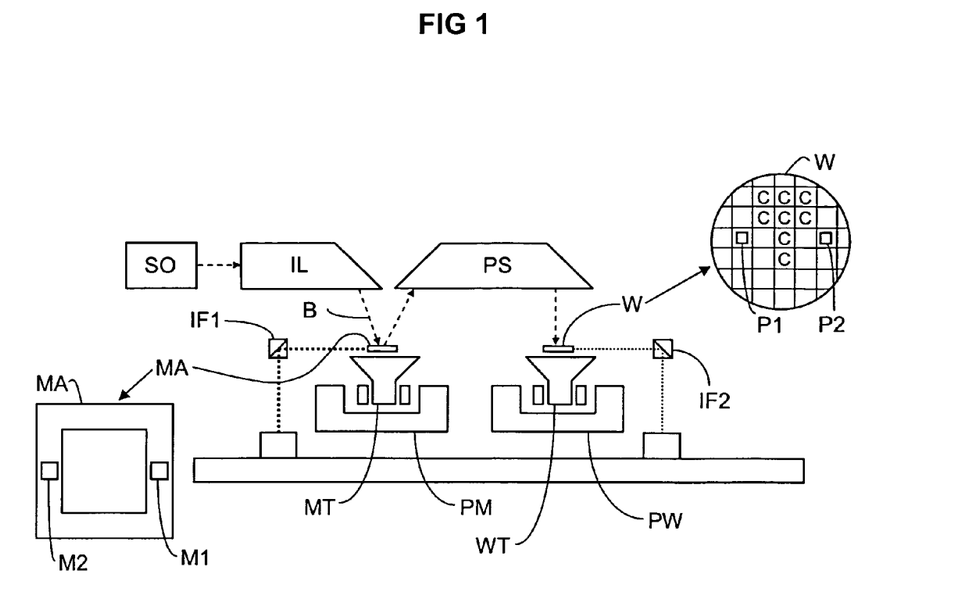
FIG. 1 depicts a lithographic apparatus according to an embodiment of the invention.

FIG. 1 schematically depicts a lithographic apparatus according to one embodiment of the invention. The apparatus comprises:

an illumination system (illuminator) IL configured to condition a radiation beam B (e.g. UV radiation or EUV radiation).

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a reflective type (e.g. employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF2 (e.g. an interferometric device, linear encoder or capacitive sensor), the substrate table WT can be moved accurately, e.g. so as to position different target portions C in the path of the radiation beam B. Similarly, the first positioner PM and another position sensor IF1 can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
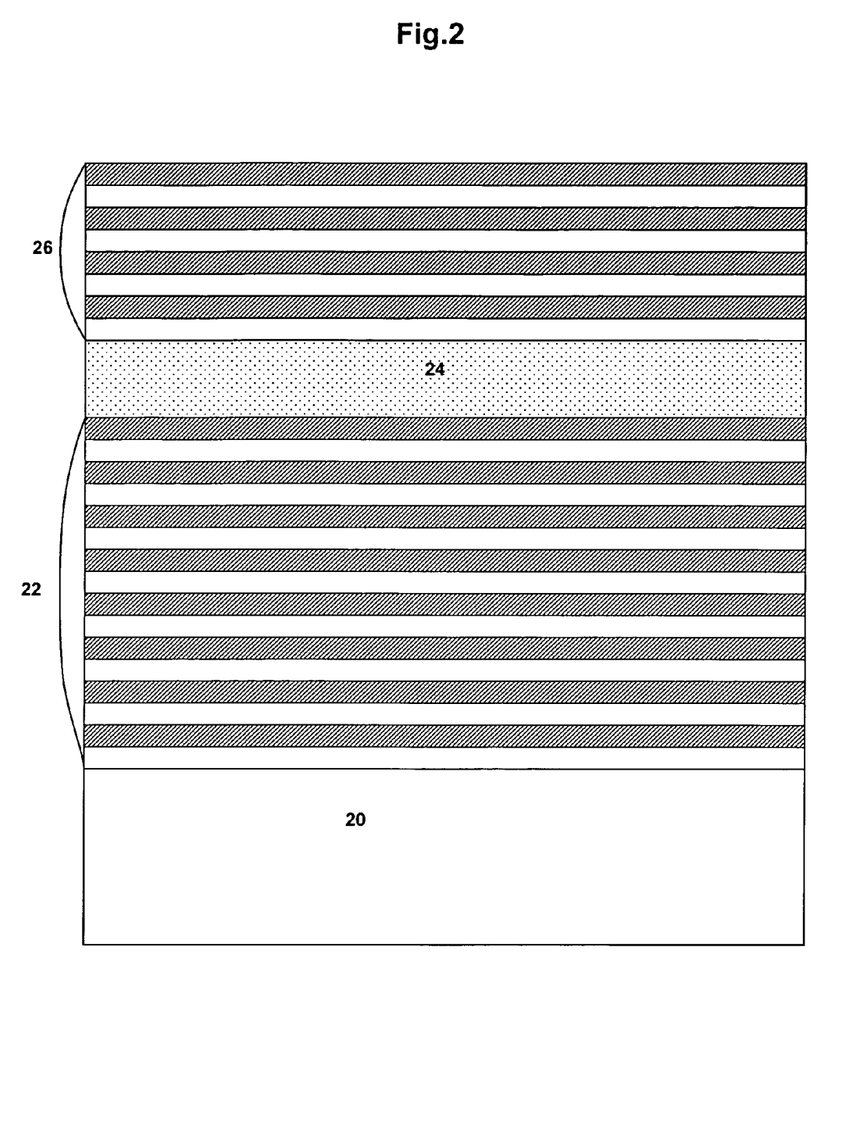
FIGS. 2-5 show cross sections of a patterning device.

FIG. 2 shows a cross-section of a patterning device. The device comprises a base 20, a lower periodic multilayer structure 22, a phase-change layer 24 and a higher periodic multilayer structure 26. Higher periodic multilayer structure 26 is provided on phase-change layer 24, which is provided on lower periodic phase-change structure 22, which in turn is provided on base 20. Phase-change layer 24 is capable of existing in at least two stable or metastable phases, which are structurally different (typically crystalline and amorphous phases). The periodic multilayer structures 22, 26, are stable under the conditions under which the patterning device is used.

Higher and lower periodic multilayer structure 22, 26 are used to reflect at least part of the incident EUV radiation. Use of periodic multilayer structures for providing high quality reflectors in the EUV range is known per se. Also techniques for manufacturing periodic multilayer structures for this purpose are known per se. Therefore they will not be described in detail. In an exemplary embodiment alternate layers of silicon and molybdenum may be grown with layer thicknesses selected according to the intended wavelength of the patterning beam.

The reflectivity of this type of periodic structure depends on the number of layers in the periodic structure. The number of layers of higher periodic multilayer structure 26 is selected so that substantially half the radiation that emerges from higher periodic multilayer structure 26 is obtained by reflection by that structure and the other half is obtained by reflection by lower periodic multilayer structure 22. Lower periodic multilayer structure is preferably designed so reflect substantially all incident radiation (e.g. more than 90%).

Phase-change layer 24 comprises a phase-change material. The composition of this material as such is not relevant, as long as the material is of a type wherein phase changes are accompanied by changes in optical path length. In an embodiment, a phase-change layer 24 composed of $Ge_4SbTe_5$ may be used, but other materials, such as $AgInTe_2$, $AgSbTe_2$, $Ge_2Sb_2Te_5$ may be used as well, or more generally chalcogenide-based phase-change materials may be used for example.

The thickness of phase-change layer 24 affects the phase relation between contributions of reflection from the higher and lower periodic phase multilayer structures 22, 26 to the emerging radiation. The thickness of phase-change layer 24 is preferably selected so that these contributions interfere constructively and destructively when the phase-change material is in a first and second structural phase respectively. That is, the difference in optical path length is a half wavelength (or a half wavelength plus an integer number of wavelengths). If radiation with normal incidence is used, this translates directly into a layer thickness given the material properties in the different structural phases. When incidence at an angle is used, the angle also determines the required layer thickness in a way that is known per se. To provide for the phase relation needed for destructive interference for one structural phase, an additional layer of suitable thickness may be added next to phase-change layer 24, or a thickness of one or more layers of the lower or higher periodic multilayer structure 22 may be chosen to provide for the required phase relation. It will be appreciated that a switch from constructive interference to destructive interference is preferred, but that other switches may suffice. For example a switch between destructive interference and some, but not one hundred percent constructive interference may be used.

The structure shown is particularly suited for reflecting radiation with wavelengths in the EUV range, because periodic multilayer structures 22, 26 optimally suited for EUV reflection can be used in combination with a minimum number of layers of phase-change material.

Figure 3:
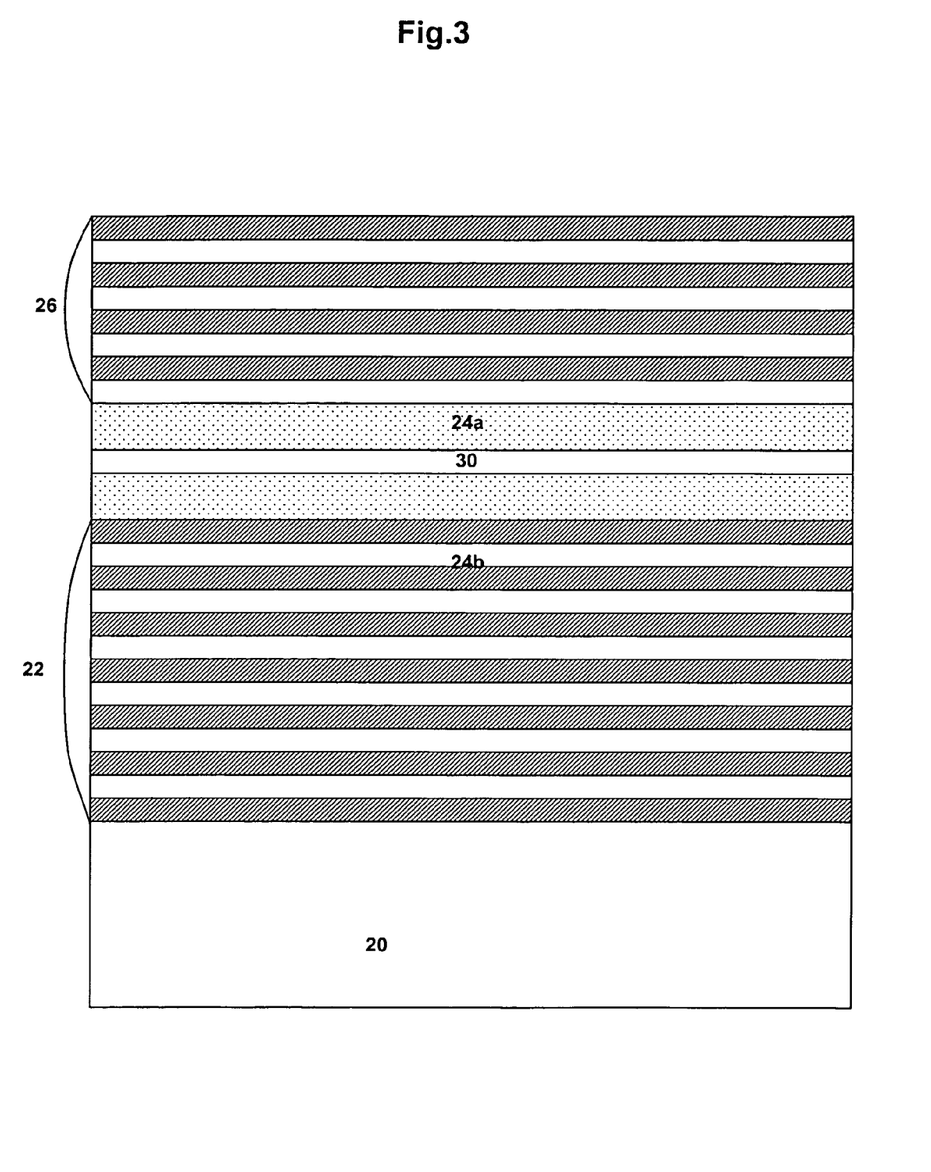

FIG. 3 shows a further embodiment wherein more than one layer of phase-change material 24a,b is used instead of single layer 24, separated by spacer layers 30, e.g. of silicon, that do not exhibit structural phase changes. Any number N>1 of layers of phase-change material 24a,b successive layers being separated by N−1 spacer layers 30 may be used. In this case the layer thicknesses of the phase-change materials are also selected to provide for a switch between non-destructive interference to destructive interference due to a phase change. By using a plurality of phase-change layers (e.g. a periodic pattern of such layers) the periodicity of the entire stack is less disturbed so that better overall reflectivity is achieved in the reflective state. It must be noted, however, that the use of a plurality of layers of phase-change material requires better thickness and roughness control during manufacturing than a single layer. At least if this accuracy cannot be realized, a single layer is preferred. Also, instead of the spacer layer 30 or the spacer layers one or more further reflective, periodic multilayer structures may be used between the layers of phase-change material 24a,b. This also provides for better periodicity, but single layer spacers between the layers of phase-change material 24a,b are preferred because this provides for a sharp phase shift.

In operation a pattern is written into the patterning device by heating the phase-change material using a laser beam that is focused in phase-change layer 24 and scanned in a lateral direction of the patterning device. In order to achieve a phase change from the crystalline phase to the amorphous phase at a selected location in the patterning device, a short laser pulse focused in the layer is applied to the selected location. The intensity and duration of the laser pulse are chosen so as to melt the illuminated volume of phase-change material, which is subsequently quenched in the amorphous state by the surrounding material. In order to achieve a phase change from the amorphous phase to the crystalline phase, a laser pulse with lower intensity and/or longer duration is used to heat the illuminated volume of phase-change material to a specific crystallization temperature. In an embodiment areas of phase-change material are first irradiated in a way that induces a phase change to the crystalline phase and subsequently selected sub-areas in these areas are irradiated in a way that induces local changes to amorphous phase in the sub-areas.

The laser beam is directed to different locations in the phase-change layer (e.g. by moving the laser source, rotating a mirror that reflects the laser beam to the patterning device or moving the patterning device) with its focus in the phase-change layer 24 and pulses are applied under control of data that specifies a desired reflection pattern. As will be appreciated, the fact that only one or a few localized layers of phase-change material are used in the patterning device (the majority of the reflectivity being provided by the periodic multilayer structures that do not exhibit phase changes at least under the conditions under which the patterning device is used), makes it easier to write patterns into the patterning device. As the beam needs to be focused only over a very shallow depth high resolution can be achieved.

Figure 4:
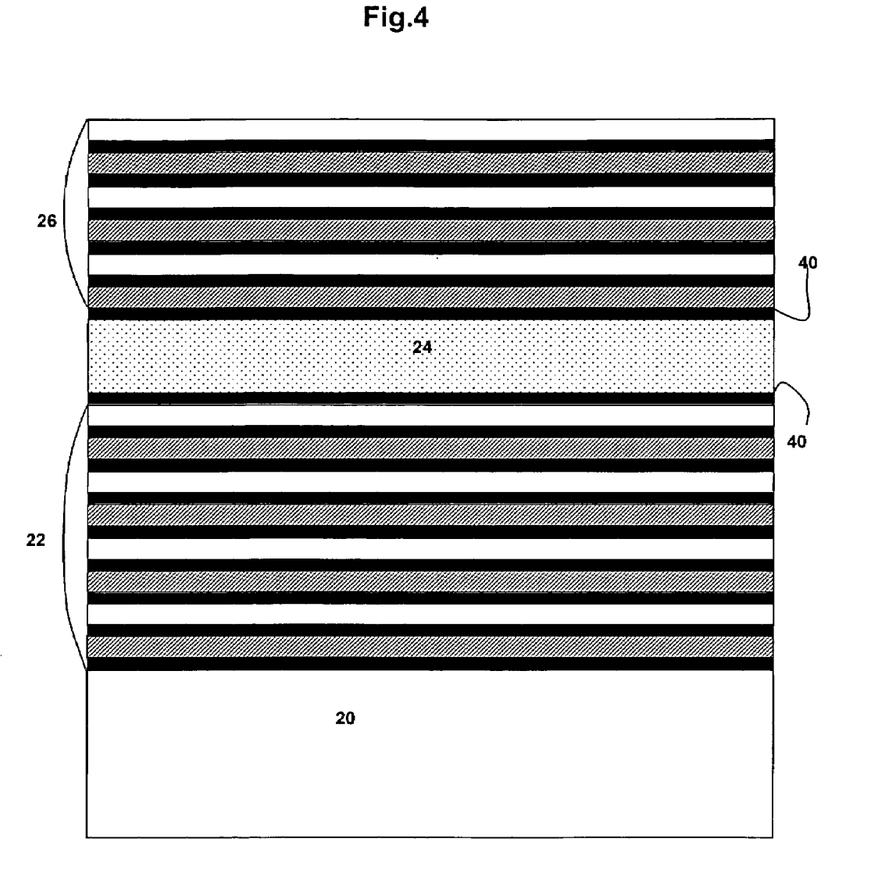

In practice, the depth of focus of the laser beam is typically of the same order (e.g. 100 nm) as the total thickness of the layer structure. Therefore, considering that the multilayer materials (e.g. Mo and Si) have an appreciable absorption coefficient at typical laser wavelengths, at least part of the multilayer structure surrounding the phase-change layer(s) is also heated to high temperatures. However, since the duration of the laser pulses is very short, intermixing of the multilayer materials by diffusion is expected to be minimal. To further restrict diffusion, diffusion barrier layers may be provided between the layers of the multilayer structures and adjacent to the phase-change layer(s). FIG. 4 shows an embodiment wherein diffusion layers 40 (not to scale) are provided between successive layers on either side of phase-change layer 24 (or a plurality of phase-change layers). Layers of boron carbide may be used for example. Diffusion barrier layers 40 serve to reduce vertical atomic diffusion at elevated temperatures, so as to maintain a well-defined multilayer structure, when the structure is heated to induce phase changes.

As an alternative to heating with a laser, a heating element or an array of heating elements of resistive material may be included in the patterning device, for example in base 50, or between the other layers, with connections that allow selected ones of the heating elements to be heated.

In another embodiment a plurality of heating elements is provided. In operation, electrical current is applied through selected heating elements to create a pattern of crystalline and amorphous regions. A rectangular matrix of heating elements may be provided for example, each comprising resistive material. Alternatively any other pattern of heating elements may be provided. In one example, this may be applied to a patterning device for defining a metal layer in a semi-conductor device, with components at predetermined positions, such as a gate array, the metal layer defining whether or not connections at predetermined locations will be present in the semi-conductor device. In this case the heating elements may be provided at locations that correspond to these predetermined positions.

Figure 5:
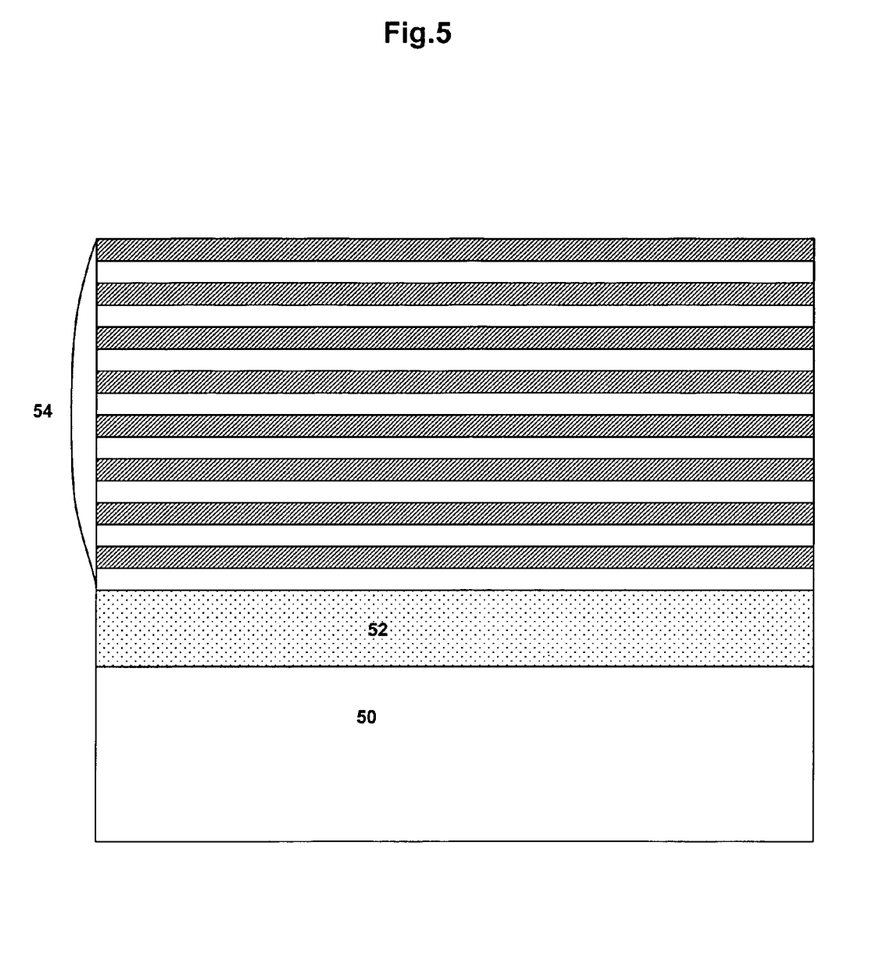

FIG. 5 shows a cross section of a patterning device comprising a base 50, a phase-change layer 52 and a periodic multilayer structure 54. Periodic multilayer structure 54 is provided on phase-change layer 52, which in turn is provided on base 50. In the device of this figure, substantially all (e.g. at least 80%) of the beam radiation that is reflected by the device is reflected in periodic multilayer structure 54 and not by phase-change layer 52 or the interface with the phase-change layer. In the device of this figure, a change in surface roughness of phase-change layer 52 due to phase changes is used to modify the roughness of the layers in the overlying periodic multilayer structure 54. By increasing the roughness of the layers in the overlying periodic multilayer structure 54, the reflectivity of the overlying periodic multilayer structure 54 is reduced.

It has been found that phase-change materials, in particular those based on chalcogenide alloys, have less surface roughness when in the amorphous state. This is attributed to the fact that the material comprises a plurality of small crystals when in the crystalline state, the grain structure due to the small crystals determining surface roughness. This effect can even be enhanced by allowing the phase-change material only partially to crystallize, by heating it for less time than needed to achieve a fully crystallized phase. Thus, a mixture of small regions in the crystalline and amorphous phases is obtained, with even higher surface roughness resulting from the difference in mass density between the crystalline and amorphous phases. Another way of enhancing this effect is to use a specially roughened base 50.

In an embodiment the patterning device of FIG. 5 is manufactured by providing a base 50 with a phase-change layer 52 thereon in the amorphous phase and growing the periodic multilayer structure 54 on the phase-change layer 52 in the amorphous phase. Thus a periodic multilayer structure 54 with minimal initial roughness is realized. A base 50 with a phase-change layer 52 in the amorphous phase may be realized by depositing phase-change layer 52 in the amorphous phase, or by depositing phase-change layer 52 and subsequently heating and quenching it to attain the amorphous phase. In a further embodiment base 20 is roughened before depositing phase-change layer 52, so that the phase-change layer has a non-uniform thickness. In this embodiment, the volume decrease of the phase-change layer upon crystallization is used to create additional roughness. An example of a roughening process is chemical etching. The introduced roughness of the base should have a correlation length that is small enough to cause appreciable scattering of the incident radiation. In an embodiment roughening is applied only to a part of the surface of the patterning device (i.e. of the surface that faces the beam of radiation), more specifically only to the part that is used for patterning the beam.

When a pattern is defined the phase-change layer may be written by means of a laser beam as described in the preceding. The laser beam may be applied through periodic multilayer structure 54 and/or through base 20. In a further embodiment a special form of laser illumination is used when transferring phase-change material 52 to the crystalline phase, with pulses that are sufficiently long to change a part of the material in the beam to the crystalline state during the pulse, but shorter than minimally necessary to change all of the material in the beam to the crystalline state during the pulse. The pulse duration required for this may be established experimentally by observing reflectivity as a function of pulse duration. For small pulse duration reflectivity is first high (due to low surface roughness in the amorphous phase) and with increasing pulse duration it drops off to a minimum (due to partial crystallization) only to rise again slightly for longer pulse duration (due to full crystallization).

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A patterning device for imparting a cross-sectional pattern to a radiation beam to form a patterned radiation beam, the patterning device comprising:
    a layer of phase-change material capable of structural phase change into a stable and/or or a metastable state at one or more locations therein; and
    a radiation reflective structure with periodically arranged layers adjacent to said layer of phase-change material, the radiation reflective structure comprising a material that maintains its structural phase when a phase change is induced in the layer of phase-change material.

2. The patterning device according to claim 1, wherein the layer of phase-change material comprises a chalcogenide alloy.

3. The patterning device according to claim 1, wherein the radiation reflective structure comprises a first sub-stack and a second sub-stack, each of the first and second sub-stacks comprising a respective radiation reflective periodic arrangement of layers, the first sub-stack, the layer of phase-change material, and the second sub-stack successively more distant from a reflection surface of the patterning device.

4. The patterning device according to claim 3, the first sub-stack comprising one or more layers selected so that, for at least one angle of incidence of the radiation beam on the patterning device, the first sub-stack has a partial reflectivity that results in substantially equal amplitude components of radiation in the of the radiation beam as the radiation beam that emerges from the patterning device due to a reflection by the first sub-stack and the second sub-stack.

5. The patterning device according to claim 3, wherein a top surface of the layer of phase-change material is in direct contact with a bottom surface of the first sub-stack and a bottom surface of the layer of phase-change material is in direct contact with a top surface of the second sub-stack.

6. The patterning device according to claim 3, further comprising a plurality of layers of phase-change material, including said layer of phase-change material, wherein the layers of phase-change material are separated by one or more spacer layers comprising a material that maintains its structural phase when the layers of phase-change material are induced to the phase change.

7. The patterning device according to claim 3, comprising a diffusion barrier layer arranged at least one of between the layer of phase-change material and the radiation reflective structure and between adjacent layers of the periodic arrangement of layers in the first and second sub-stacks of the radiation reflective structure.

8. The patterning device according to claim 3, wherein each of the first and second sub-stacks comprises alternating layers of Mo and Si.

9. The patterning device according to claim 1, wherein the radiation reflective structure is arranged between a reflection surface of the patterning device and the layer of phase-change material, the radiation reflective structure comprising one or more periodic layers arranged to provide for reflection of substantially all of the radiation beam that contributes to a reflected radiation beam.

10. The patterning device according to claim 1, wherein the layer of phase-change material comprises a pattern of different areas in mutually different phases, that defines the cross-sectional pattern to be imparted to the radiation beam.

11. A method of providing a patterning device for imparting a cross-sectional pattern to a radiation beam to form a patterned radiation beam, the method comprising:
    providing a layer of phase-change material adjacent to a reflective periodic multilayer structure in the patterning device, the reflective periodic multilayer structure comprising a material that maintains its structural phase when a phase change is induced in the layer of phase-change material; and
    heating the layer of phase-change material with a position-dependent heating pattern as a function of position in the layer of phase-change material, with at least one of a time dependence of a heating pulse and heating intensity that induces local phase changes in the layer of phase-change material, to define a pattern with one or more areas of mutually different phases in the layer of phase-change material.

12. The method according to claim 11, further comprising imparting the cross-sectional pattern to the radiation beam by reflecting the radiation beam off the reflective periodic multilayer structure after defining the pattern with one or more areas of mutually different phases in the layer of phase-change material.

13. The method according to claim 12, wherein the radiation beam comprises extreme ultraviolet (EUV) radiation.

14. The method according to claim 11, wherein the patterning device comprises the layer of phase-change material arranged between a first sub-stack and a second sub-stack of the reflective periodic multilayer structure, each of the first and second sub-stacks comprising a respective periodic arrangement of layers, the first sub-stack, the layer of phase-change material, and the second sub-stack successively more distant from a reflection surface of the patterning device.

15. The method according to claim 11, wherein the reflective periodic multilayer structure is arranged between the layer of phase-change material and a reflection surface of the patterning device, the method further comprising reflecting substantially all of the radiation beam off the reflective periodic multilayer structure and inducing local changes of roughness in the reflective periodic multilayer structure with local phase changes in the layer of phase-change material.

16. The method according to claim 11, wherein heating the layer of phase-change material comprises:
   heating the layer of phase-change material to bring a first area of the layer of phase-change material into an amorphous phase, and subsequently
   inducing a crystalline phase in a second area within said first area of the layer of phase-change material by heating the second area for a predetermined duration that is shorter than an overall duration for inducing full crystallization in the layer of phase-change material.

17. The method according to claim 11, further comprising providing the layer of phase-change material on a base and roughening the base before providing the layer of phase-change material.

18. The method according to claim 11, further comprising applying the reflective periodic multilayer structure on the layer of phase-change material while the layer of phase-change material is in an amorphous phase.

19. A lithographic apparatus comprising:
   an illumination system configured to condition a radiation beam;
   a support constructed to support the patterning device, the patterning device being capable of imparting the radiation beam with a pattern in its cross-section to form a patterned radiation beam, wherein the patterning device comprises:
      a layer of phase-change material capable of structural phase change into a stable or a metastable state at one or more locations therein; and
      a radiation reflective structure with periodically arranged layers adjacent to said layer of phase-change material, the radiation reflective structure comprising a material that maintains its structural phase when a phase change is induced in the layer of phase-change material;
   a substrate table constructed to hold a substrate; and
   a projection system configured to project the patterned radiation beam onto a target portion of the substrate.

20. The lithographic apparatus according to claim 19, wherein the radiation beam comprises extreme ultraviolet (EUV) radiation.

21. The patterning device according to claim 1, further comprising a base arranged below a surface of the layer of phase-change material, the surface being opposite of a reflection surface of the patterning device, wherein the base comprises an array of heating elements configured to heat one or more portions of the layer of phase-change material.

* * * * *

UNITED STATES PATENT AND TRADEMARK OFFICE
CERTIFICATE OF CORRECTION

| | | |
|---|---|---|
| PATENT NO. | : 7,771,896 B2 | Page 1 of 1 |
| APPLICATION NO. | : 11/643953 | |
| DATED | : August 10, 2010 | |
| INVENTOR(S) | : Soer et al. | |

It is certified that error appears in the above-identified patent and that said Letters Patent is hereby corrected as shown below:

In claim 1, column 9 and line 45, please delete "and/or"

Signed and Sealed this

Fifth Day of October, 2010

David J. Kappos
*Director of the United States Patent and Trademark Office*